(12) United States Patent
Conrad et al.

(10) Patent No.: US 6,528,219 B1
(45) Date of Patent: Mar. 4, 2003

(54) DYNAMIC ALIGNMENT SCHEME FOR A PHOTOLITHOGRAPHY SYSTEM

(75) Inventors: Edward W. Conrad, Jeffersonville, VT (US); Paul D. Sonntag, Colchester, VT (US); Arthur C. Winslow, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 09/627,205

(22) Filed: Jul. 27, 2000

(51) Int. Cl.[7] .................................................. G03F 9/00
(52) U.S. Cl. .......................................... 430/22; 430/30
(58) Field of Search ....................... 430/22, 30

(56) References Cited

U.S. PATENT DOCUMENTS 6,190,807 B1 * 2/2001 Wang et al. .................. 430/22
6,225,011 B1 * 5/2001 Gotoh et al. .................. 430/22
6,248,484 B1 * 6/2001 Sajan et al. .................... 430/22

* cited by examiner

*Primary Examiner*—Christopher G. Young
(74) *Attorney, Agent, or Firm*—William D. Sabo

(57) ABSTRACT

Photolithography tools have alignment systems for aligning a level to be printed with a level already on the wafer. Commonly a photolithography tool has several alignment systems Also, wafers may have several alignment marks, and the various alignment systems may be capable of reading several of the alignment marks. The present invention provides a method of selecting the alignment system-alignment mark combination that gives the most accurate alignment to a previous level. The inventors found that residual errors provide a metric by which to evaluate alignment system-alignment mark combinations. The combination with the least residual error is selected. Alternatively data for actual overlay measurements is compared with alignment data for each alignment system-alignment mark combination, and the combination that has the best correlation to the overlay data is selected.

28 Claims, 8 Drawing Sheets

DYNAMIC ALIGNMENT SCHEME FOR A PHOTOLITHOGRAPHY SYSTEM

FIELD OF THE INVENTION

This invention generally relates to aligning a wafer to a photolithographic system before exposing a pattern on the wafer. More particularly it relates to a method of achieving improved alignment between the wafer and the system.

BACKGROUND OF THE INVENTION

Integrated circuit chips are fabricated one level at a time. The levels include diffusions, gates, metal lines, insulation, isolation, and contacts. The structures on these levels must be precisely positioned so that the finished chip has structures properly positioned. The step of positioning a level with respect to previously formed level is called alignment. While some structures are automatically aligned or self-aligned to previously formed structures, many others must be aligned using optical techniques on a photolithography tool. These optical alignment techniques introduce error from one level to the next. To the extent this error can be reduced the performance and yield of integrated chips can be improved.

Numerous methods for alignment have been developed and are in use. Each of these methods has advantages and disadvantages depending on factors such as film thickness, material characteristics, and other processing conditions. But no single method works best for all processing conditions. Thus, a better solution for alignment is needed that provides superior alignment under a variety of conditions, and this solution is provided by the following invention.

SUMMARY OF THE INVENTION

It is therefore an object of the present invention to provide a way to reduce misalignment before exposing a wafer in a photolithography tool.

It is a further object of the present invention to take advantage of all of the various alignment techniques available on the photolithography tool and all the alignment targets on the wafer and dynamically choose the ones that gives the best alignment results.

It is a feature of the present invention that several alignment schemes are used and the one providing the least error is selected.

It is a feature of the present invention that several alignment systems are used, data is collected for each, error is measured, and the system providing the least residual error is selected.

It is an advantage of the present invention that the system providing the least residual error is selected.

It is an advantage of the present invention that the wafer is most accurately aligned to the photolithographic system.

These and other objects, features, and advantages of the invention are accomplished by a method of aligning a substrate to an exposure system comprising the step of providing a substrate on a stage of an exposure system. The exposure system includes an alignment component. The method further comprises gathering alignment data for the plurality of alignment components. The method further comprises calculating an alignment-related parameter from the alignment data for each alignment component wherein the alignment-related parameter for each component includes indication of alignment component quality. The alignment related parameter is used to select an alignment component for use in aligning the substrate. The substrate remains on the stage during these steps.

BRIEF DESCRIPTION OF THE DRAWINGS

The foregoing and other objects, features, and advantages of the invention will be apparent from the following detailed description of the invention, as illustrated in the accompanying drawings, in which:

FIG. 1b is a more detailed view of one of the alignment systems of FIG. 1a;

FIG. 4a is a top view of an actual alignment grid, an expected ideal alignment grid, and the actual error there between;

FIG. 4b is a top view of the linear contribution to the error of FIG. 4a;

FIG. 4c is a top view of the residual contribution to the error of FIG. 4a;

DETAILED DESCRIPTION OF THE INVENTION

Figure 1A:
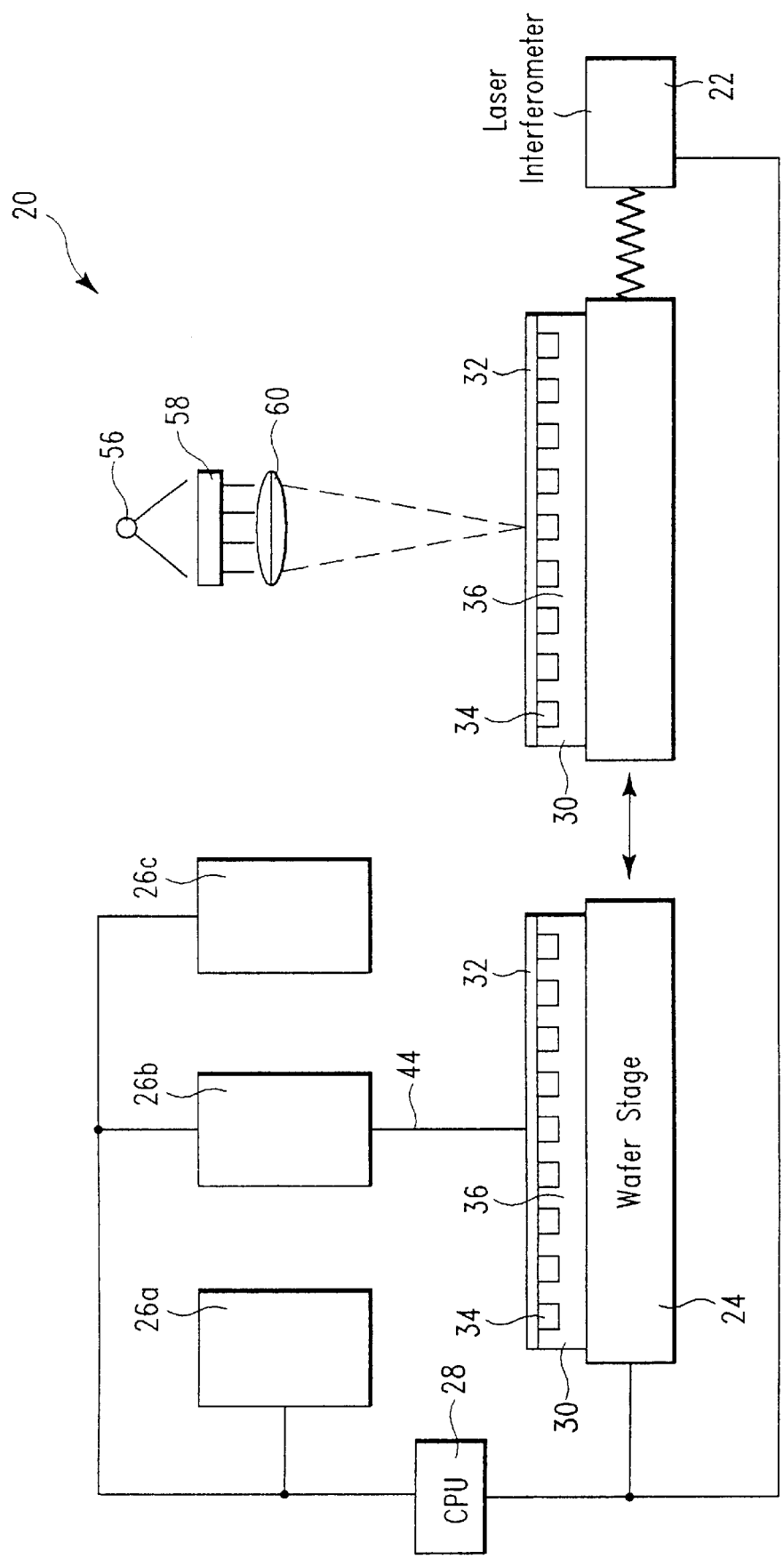
FIG. 1a is a side view of a photolithography system having several alignment systems.

Photolithography tools have alignment systems for aligning a level to be printed with a level already on the wafer. The alignment system first determines the location of an alignment target on the wafer that was printed during a previous photolithographic process step. Once the location of the alignment target is established, the system adjusts the location of the wafer so the present level is printed at the proper location with respect to that previous level target. The previous level target can be the first level printed, the last level so far printed, or any level in between.

Alignment systems on photolithography tools are generally designed to work with specific types of alignment marks on the wafer. The alignment system acquires an alignment signal by optically scanning an alignment mark. The alignment signal is then analyzed to determine the location of the alignment mark on the wafer. This is repeated for several alignment marks in different exposure fields on the wafer. From three to eight marks are typically used. The data from this group of alignment marks is then processed with a computer in the photolithography tool to determine the location of the wafer.

Commonly a photolithography tool has several alignment systems and is capable of reading several alignment marks.

Furthermore, a number of alignment signal analysis algorithms can be applied to the alignment signal. The term "alignment component" will be used in this application to describe alignment system hardware, alignment marks on a substrate, and alignment signal analysis software. One component may be better than another for aligning wafers that have been processed under different conditions. For example, a wafer with a thicker film may be better aligned on one alignment system than on another or with a dark field system rather than a bright field system.

It is well-known that the quality of the signal obtained by scanning a mark is critical to the quality of the alignment. The signal can be degraded by conventional process steps, such as chem-mech polish, and degraded signal can result in degraded alignment. In the presence of processes that can produce significant differences in alignment signals from wafer to wafer and lot to lot, the quality of the alignment signal can vary, resulting in poor alignment for some wafers and/or lots. Wafers that align poorly increase rework, reduce yields, and reduce reliability. As chem-mech polishing (CMP) processes become more common for planarizing wafers, the variability in alignment signals from wafer-to-wafer and lot-to-lot become more significant.

The present invention provides a method of selecting the alignment system-alignment mark combination or the alignment signal analysis algorithm that gives the most accurate alignment to a previous level. Alignment system-alignment mark combinations are tested and results compared to pick the one that provides the most accurate alignment. For example, there may be four alignment marks in each exposure field on a metal level of a wafer. There may be three alignment systems on the photolithography tool. All four marks in an exposure field are scanned with each alignment system. This measurement is repeated for at least four exposure fields, and preferably at least 8 exposure fields. The data for each alignment system and mark is analyzed to calculate an alignment-related parameter. Preferably, the alignment-related parameter is residual error. Residual error is determined for each system and mark combination, and this provides indication of alignment quality for that system and mark. In one embodiment the system providing the least overall error is selected and its alignment data is used for exposing chips on the wafer. The same approach is used to evaluate different alignment signal analysis algorithms and analysis parameters.

In a second embodiment several copies of a mark are provided in a single exposure field. All the marks within a single exposure field are scanned with each alignment system. This scanning of multiple marks is repeated for at least four exposure fields, and preferably at least 8 exposure fields. Within-field data variation is separated from field-to-field variation and residual errors are then determined. This scheme reduces the effect of actual variation in the location of marks on the prior level. How well an alignment system is working is demonstrated by the extent the alignment target location can be expressed as a within-field variation plus a field-to-field variation.

The invention applies to step-and-repeat or step-and-scan photolithography tools such as tool 20 shown in FIG 1a. Photolithography tool 20 includes laser interferometer 22 which controls wafer stage 24. Tool 20 also includes alignment systems 26a, 26b, 26c, and computer 28 to analyze alignment data. A substrate, such as silicon wafer 30, coated with photsensitive layer 32 and containing alignment marks 34 on prior level 36 is located on wafer stage 24.

Figure 1B:
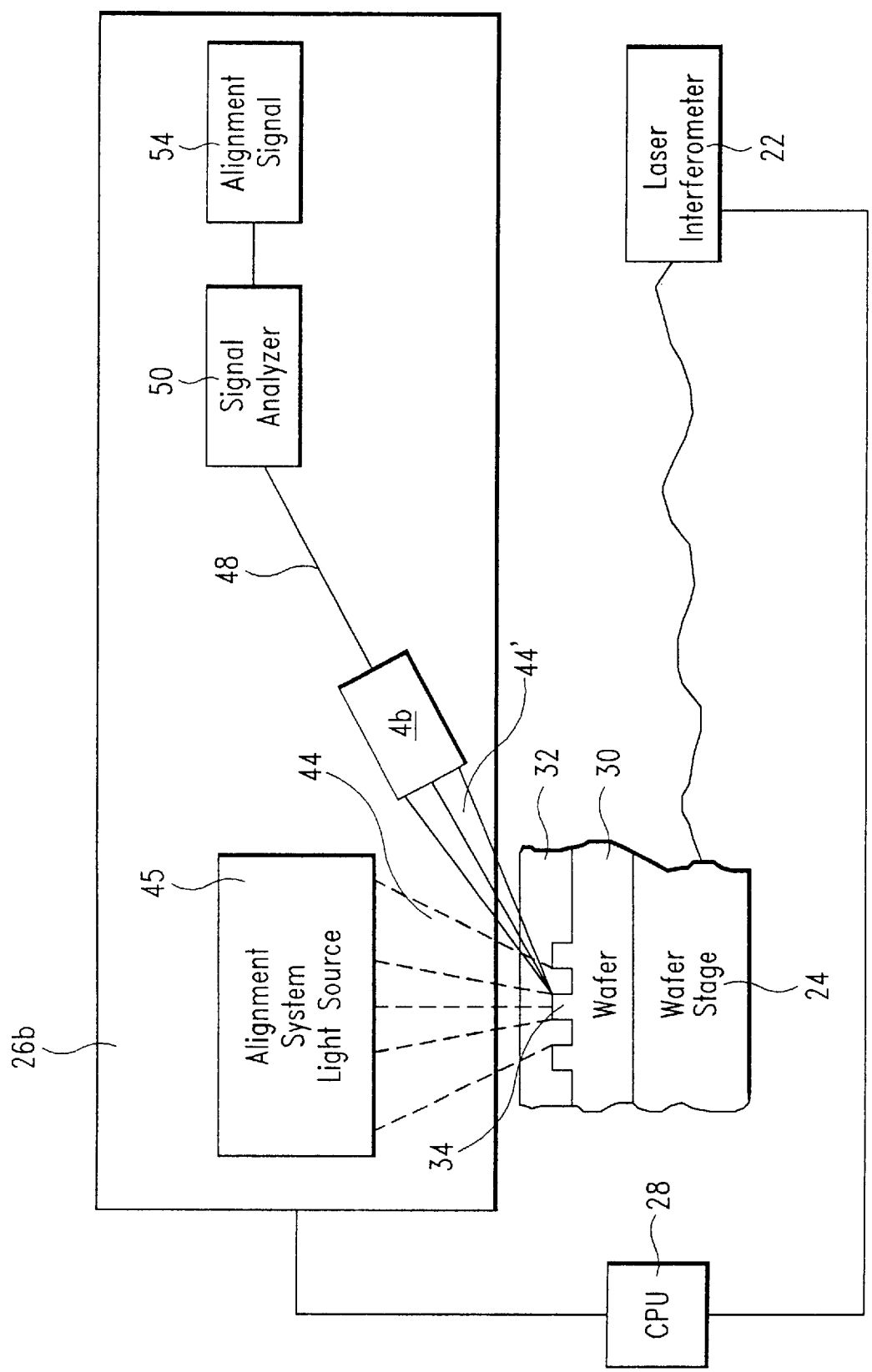

In operation, each alignment system 26a, 26b, or 26c sequentially shines incident light beam 44 from light source 45 on alignment mark 34 on wafer 30, as shown in more detail in the enlarged view of FIG. 1b. The different alignment systems are used either sequentially or in parallel, and data is collected for each. Standard alignment procedure is used for each alignment system.

In a typical alignment process as presently practiced in the industry, light beam 44 from alignment system 26b is focused on a portion of alignment mark 34 on wafer 30 and is diffracted by that portion over a wide range of angles. Some of that diffracted light 44' is gathered by detector 46 which converts it to an electrical signal which is transmitted along wire 48 to signal analyzer 50 which includes an analog to digital converter. Wafer stage 24 is moved so that incident light 44 scans across alignment target 34 so signal is eventually received from all portions of alignment mark 34. As alignment target 34 is scanned, light signal 44' striking detector 46 varies in intensity, and electrical signal output 48 from detector 46 correspondingly varies. Signal 48 is correlated with wafer stage position information from interferometer 22 to produce alignment signal 54, the output of signal analyzer 50. The location of alignment target 34 is then determined from characteristics of electrical signal 54 using computer 28. This signal is analyzed with standard analysis algorithms. However, parameters of these algorithms can be changed and evaluated using the method of the present invention. For example, alignment can be measured at each alignment mark several times, each time with a different signal threshold value. Exposure system 20 also includes illuminator 56, reticle 58, and objective lens 60, as shown in FIG. 1a.

Figure 2:
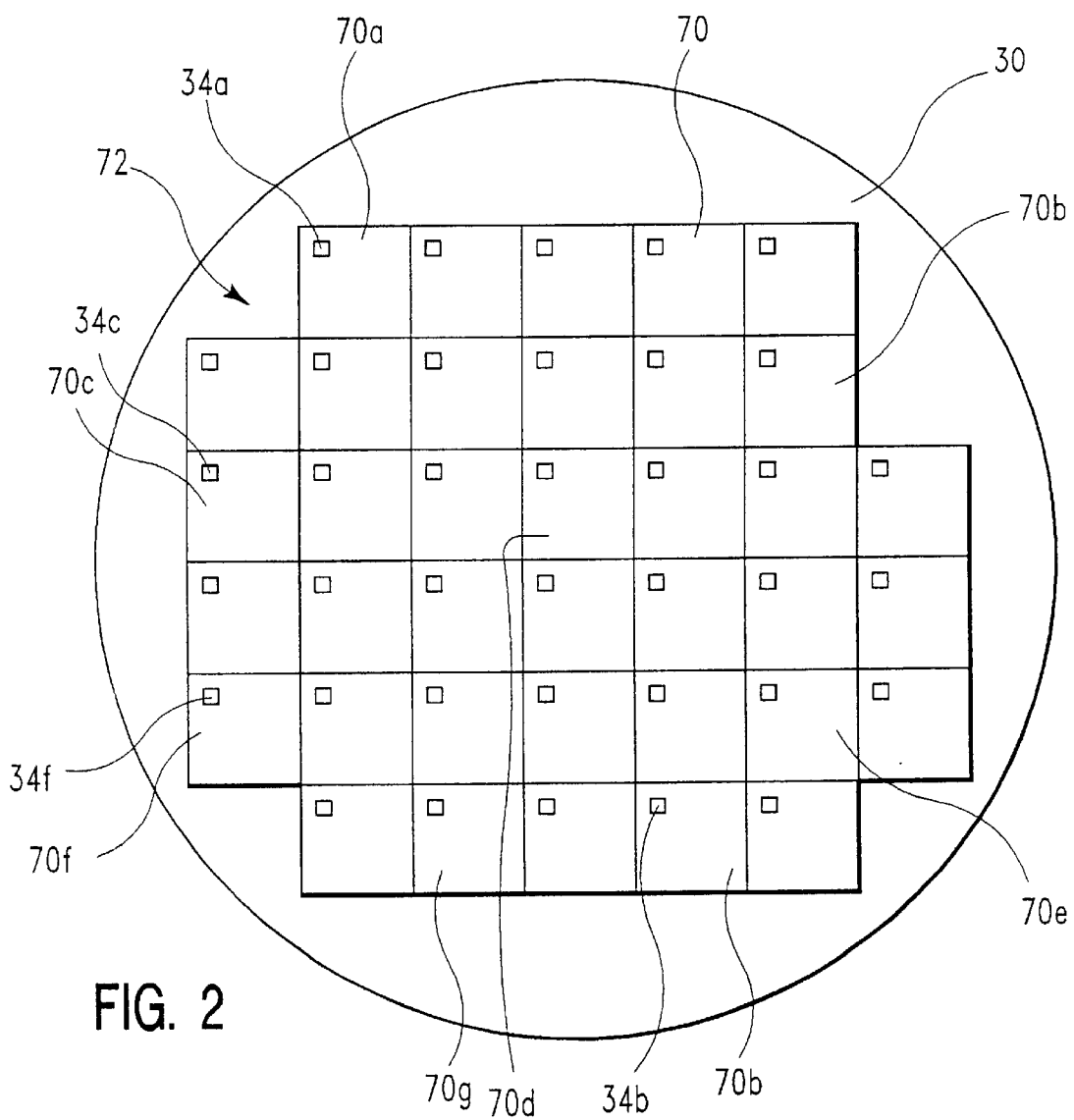
FIG. 2 is a top view of a wafer having multiple exposure fields and an alignment target in each exposure field.
Figure 3:
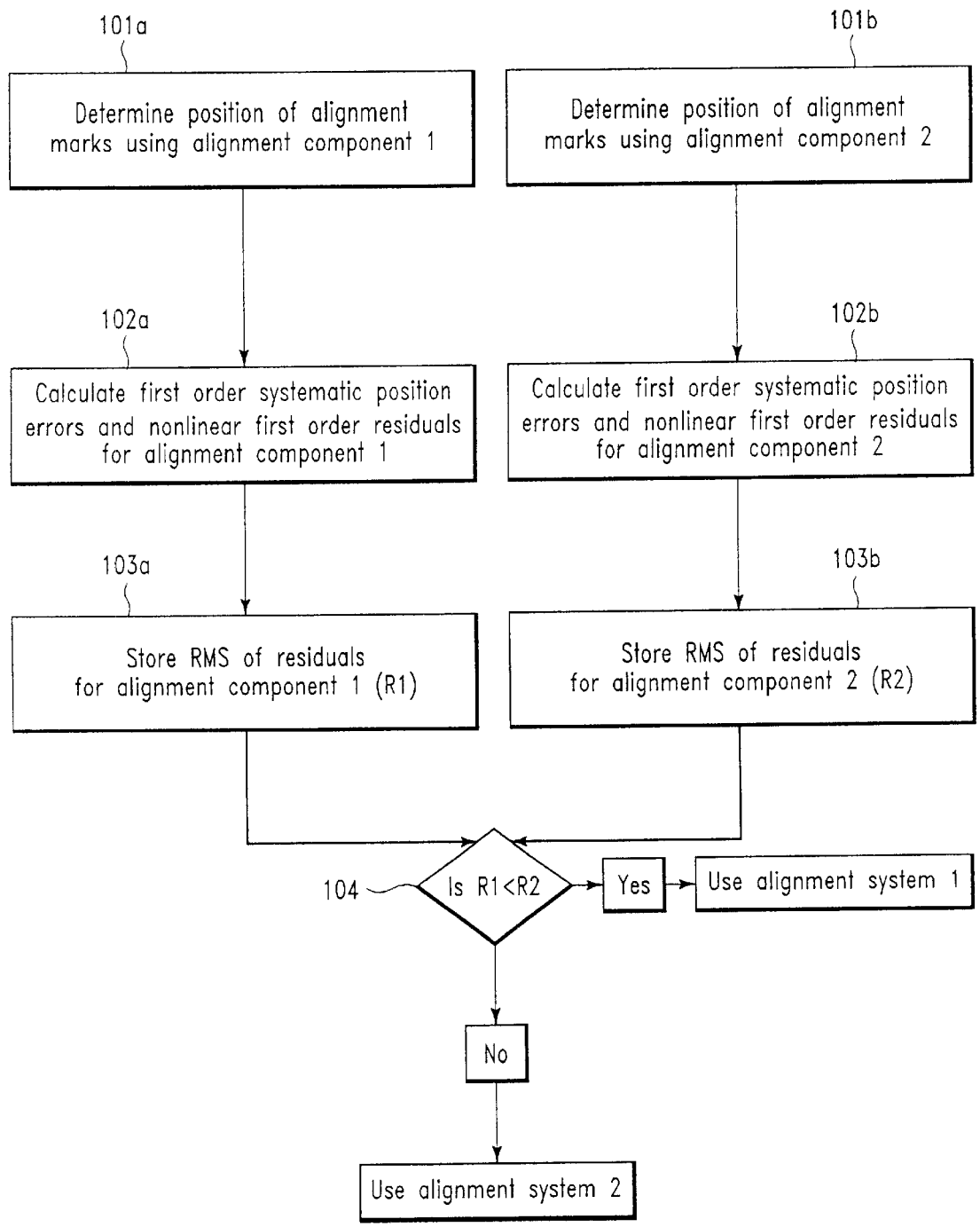
FIG. 3 is a flow chart showing process steps for the first embodiment of the present invention.

In standard practice, step-and-repeat or step-and-scan photolithography tools place exposure fields 70a, 70b . . . 70i on wafer 30 in array pattern, as shown in the top view of FIG. 2. The first exposure field 70a at which alignment data is to be collected is positioned in the field of view of first alignment system 26a, and the location of alignment mark 34a in field 70a is determined as shown in step 101a, 101b of the flow chart of FIG. 3. The location of an alignment mark may be defined as the location of the center of the mark, and this x-y location is saved for later processing.

Next, second alignment field 70b is positioned in the field of view of first alignment system 26a, and the location of alignment target 34b field 70b is determined, as provided in standard practice, well known in the industry. This procedure is continued for additional exposure fields 70c, 70d, 70e or to a number of fields chosen by the user. At least four fields are required for the current embodiment, with eight or more alignment fields being preferred. All this saved location data is then used to calculate first order systematic error and the first order residuals, as shown in step 102a, 102b in FIG. 3.

Table 1 includes hypothetical data for alignment values as determined from step-and-repeat photolithography tool 20. Nine sets of X and Y coordinate values are shown, one for each exposure field, but the technique can be applied to any number of exposure fields and coordinate pairs exceeding 3.

| Field # | X Location (expected) | Y Location (expected) | X Location (actual) | Y Location (actual) | X error | Y error |
|---|---|---|---|---|---|---|
| 1 | −30 | 30 | −29.99812 | 29.97265 | 0.00189 | −0.02735 |
| 2 | 0 | 30 | 0.00169 | 30.00245 | 0.00169 | 0.00245 |
| 3 | 30 | 30 | 29.993685 | 30.002735 | −0.0063 | 0.00274 |
| 4 | −30 | 0 | −29.9994 | 0.00332 | 0.0006 | 0.00332 |
| 5 | 0 | 0 | −0.0044 | 0.0045 | −0.0044 | 0.0045 |
| 6 | 30 | 0 | 29.9974 | 0.00429 | −0.0026 | 0.00429 |
| 7 | −30 | −30 | −30.00385 | −29.99764 | −0.0039 | 0.00237 |
| 8 | 0 | −30 | 0.00315 | −29.99865 | 0.00315 | 0.00135 |
| 9 | 30 | −30 | 29.995115 | −29.99517 | −0.0049 | 0.00484 |

Figure 4A:
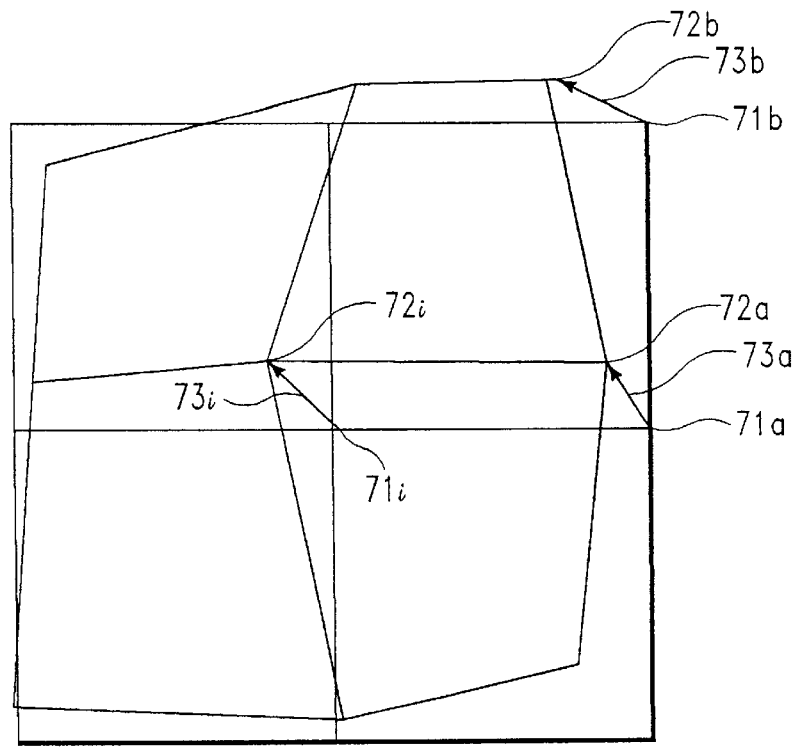

Ideal grid 71 is defined by the expected alignment target locations 71a, 71b, . . . 71i shown in FIG. 4a and listed in the second and third columns of table 1. The actual locations of the alignment targets 72a, 72b, 72i in the next two columns can be modelled mathematically using six linear systematic coefficients, $S_x$, $M_x$, $\alpha_y$, $S_y$, $M_y$, $\alpha_x$. It is convenient to express the alignment information in terms of error or deviation from an expected location or ideal grid. Error or deviation of actual grid 72 from ideal grid 71 is shown as right two columns of Table 1. This is also illustrated in FIG. 4a as vectors 73a, 73b . . . 73i connecting actual with expected grid locations for one of the sets of grid locations.

Figure 4B:
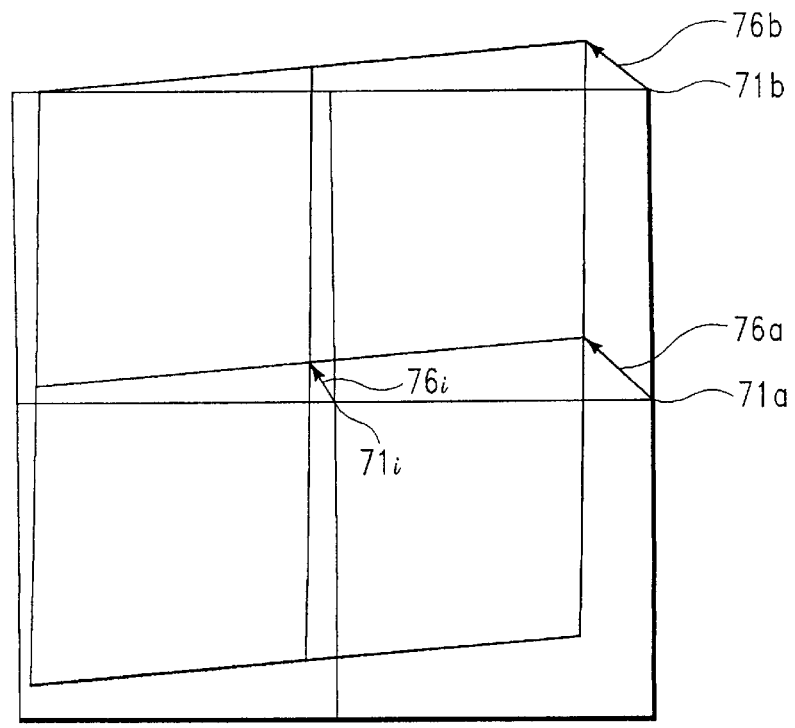
Figure 4C:
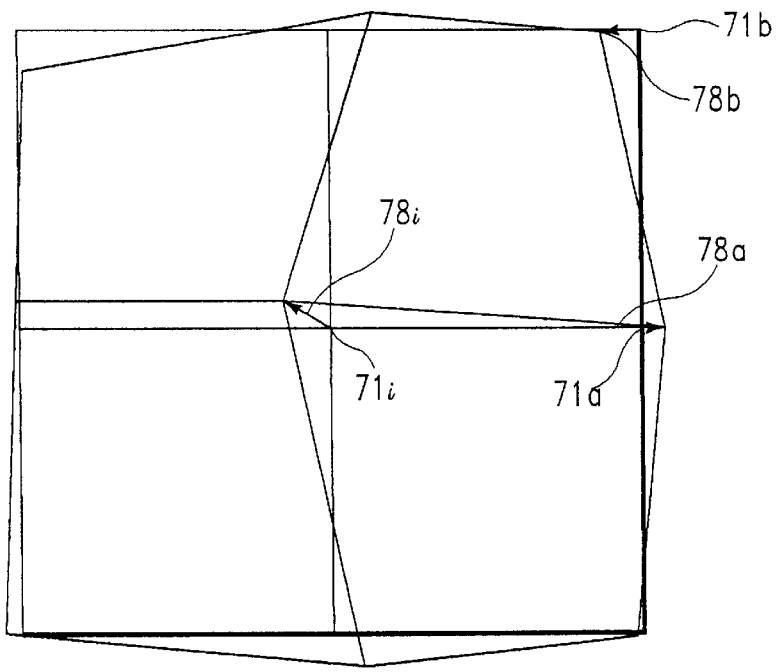
Figure 5A:
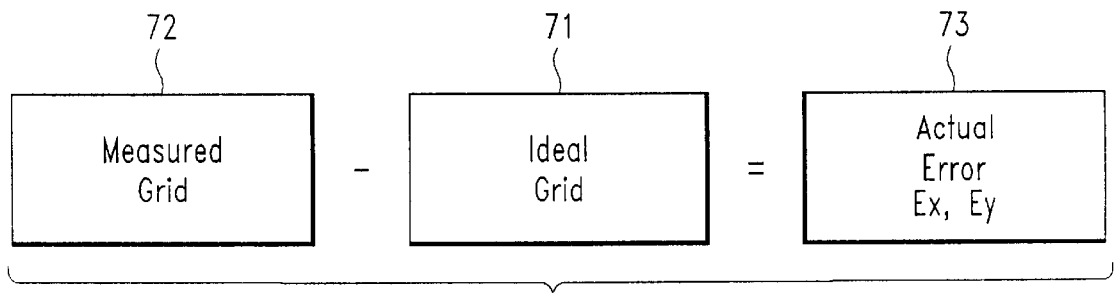
FIG. 5a is a block diagram of FIG. 4a showing the actual error being the ideal grid subtracted from the measured grid.
Figure 5B:
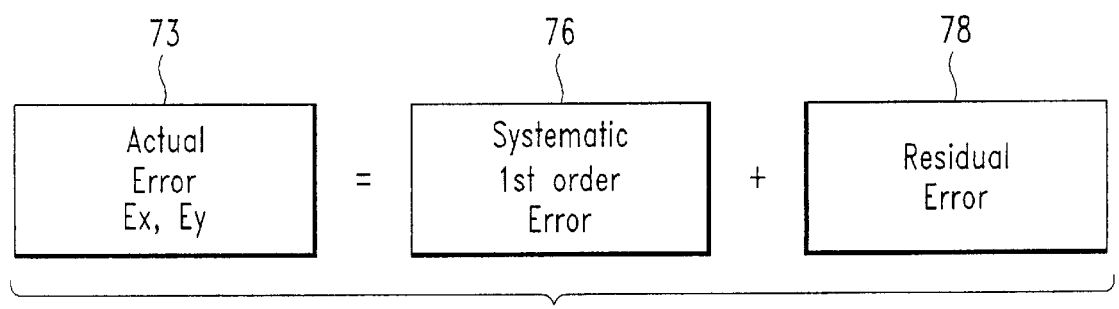
FIG. 5b is a block diagram showing the actual error being the sum of systematic first order error and residual error.

This approach is schematically represented in FIG. 5a. Actual error 73 includes any deviation in the location of a target on a prior level plus any error introduced by the measurement system. Actual error 73 is calculated as measured grid location 72 minus ideal grid location 71. This calculated actual error 73 is modelled mathematically as systematic first order error 76 plus residual error 78, as shown in FIG. 5b. The systematic first order error 76 contribution to actual error 73 is shown in grid format FIG. 4b. The residual error 78 contribution is shown in FIG. 4c.

In the mathematical model, the x component of error $E_x'$ in the location of alignment target 34 can be accounted for as the sum of three terms, shift error $S_x$, magnification error $M_x X$ and rotation error $\alpha_y Y$. Similarly the y component introduces another three terms. Shift error is translation along x and y from the expected position. Magnification error is stretching of the grid in one or both directions. Rotation error includes the amount of non-orthogonality of the two axes because each may be rotated a different amount from the ideal expected grid. Each of the six terms for the X and Y components is called a systematic component of error or a first order error term.

Thus, the following equation provides a linear mathematical model of the X component of error:

$$E_x' = S_x + M_x X + \alpha_y Y$$

Similarly, the following equation provides a mathematical model of the Y component of error:

$$E_y' = S_y + \alpha_x X + M_y Y$$

This mathematical model for each target is a linear fit of the actual error $E_x$, $E_y$. The model does not include all the terms needed to fully describe the actual error, $E_x$, $E_y$, since the model includes only the six linear terms. In addition to the six terms there are also residual or nonlinear terms necessary to completely characterize actual error $E_x$, $E_y$. These additional components of error arise when the number of targets measured provides more data than needed to solve for the six first order systematic terms. Since each target provides x and y data, if more than three non-colinear targets are measured residual terms arise and can be calculated.

Figure 6:
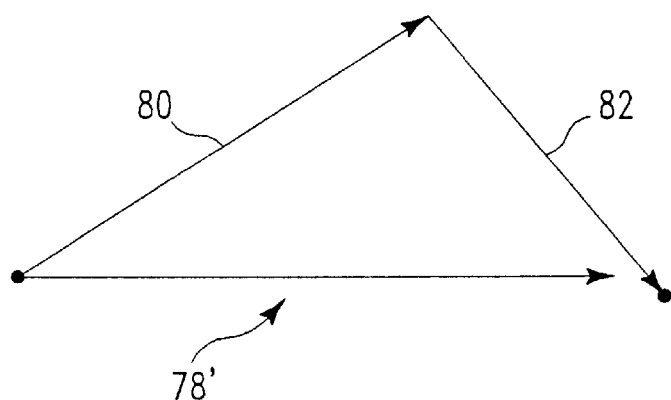
FIG. 6 is a vector diagram showing the residual error as the vector sum of actual error in the field position printed in a prior level and measurement error associated with the alignment system.

The present inventors discovered that residual terms 78 can be used to characterize the performance of each alignment system, each alignment mark, or each signal analysis parameter. They found that the alignment component with the smallest residual terms 78 is the one that works best at a particular level. Present day alignment systems have the ability to calculate these residual terms but they have not been used to dynamically select the best alignment system, the best alignment mark, or the best alignment algorithm or parameter. The inventors recognized that residual error 78 has two contributors, prior level contributor 80 that is the same for all such alignment components, and alignment system contributor 82 that varies with which alignment component is used, as shown in FIG. 6. Since prior level contributor 80 is the same for all alignment components, the inventors reasoned, the system that produces the least residual 78 is the one that has the least alignment component contribution 82. It is therefore the lowest noise component and the one that works best to align the wafer.

Residual terms are calculated by subtracting the position error described by the six systematic components from the actual error in the locations measured by each alignment system as shown in FIG. 5b. A convenient metric for the residual term for each alignment system is the root mean square (RMS) of the residuals calculated for each target location, as shown in step 103a, 103b of FIG. 3. Other metrics such as mean square, sum of the squares, and standard deviation can be used. This metric is compared with the same metric for each other alignment system or alignment target, as shown in decision step 104, and the system or target having the smallest RMS residual is selected.

Figure 7:
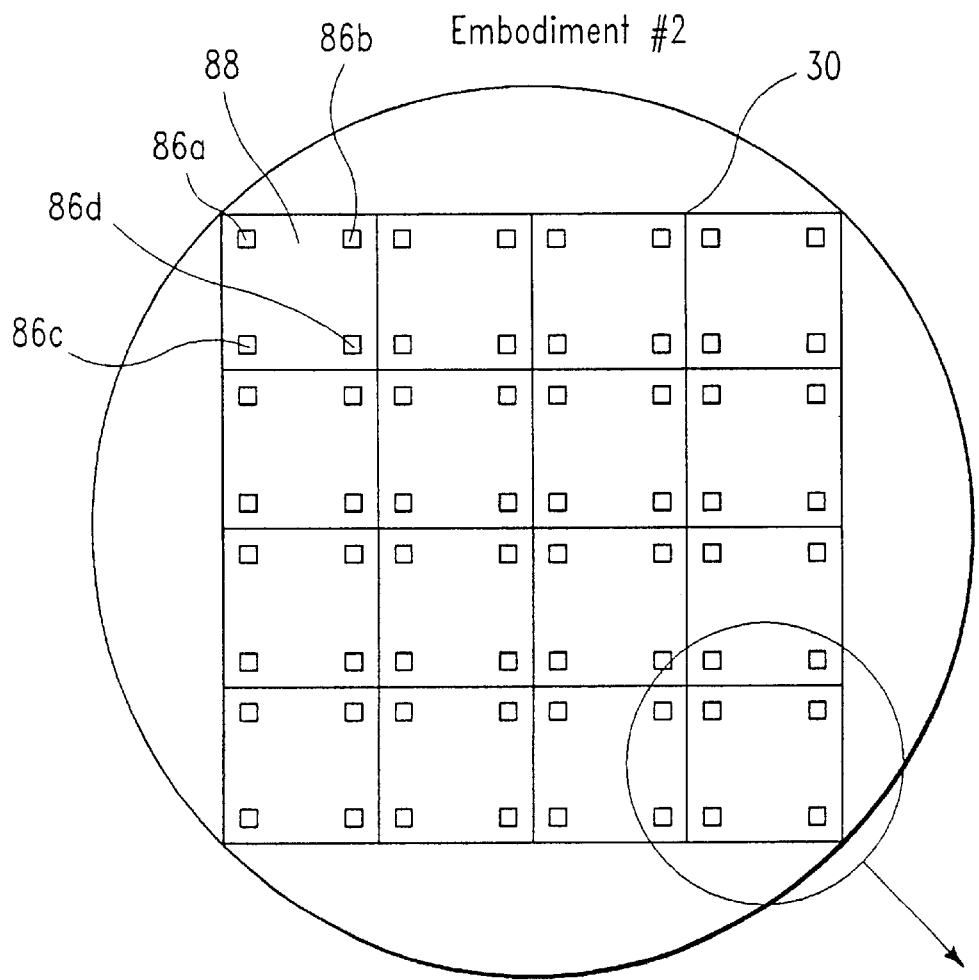
FIG. 7 is a top view of a wafer having several alignment targets in each exposure field.

Alternate schemes and mathematical models can be used in practicing the present invention. In a second embodiment of the invention multiple alignment targets 86a, 86b, 86c, 86d are in each alignment field 88 on wafer 30, as shown in FIG. 7. In this second embodiment, two or more alignment targets are measured in each of two or more stepper fields. Preferably at least four sites per field and at least eight fields are measured. This scheme has the advantage that the calculated residual does not contain a significant contribution from the previous level and is primarily composed of error from the measurement itself. The mathematical model of the error involves a translation component associated with the stage and a field component associated with the objective lens of the photolithography system. For step-and-scan systems the field component also has contribution from the scan characteristics of the system.

Using the method described here, the stepping error and scanning error can be removed from the alignment data. The residual error that remains after removal of the within field errors (commonly called field distortion) and removal of the field placement errors are called the second residuals. These second residuals are used to select the alignment system or alignment target that works best.

Mathematically, we express the error $E_{i,j}$ in the location of alignment target number i in field number j as the sum of the field component associated with target i and the translation component associated with the prior level for field j. That is:

$$E_{i,j} = T_i + L_j$$

The set of all such equations for all the targets in all the measured alignment fields defines a linear system of equations. An additional constraint is needed to solve the set of equations such as the sum of $\Sigma L_j = 0$, the system of equations can be solved to provide all $T_i$ and $L_j$ values. Subtraction of these translation and lens errors from the alignment data yields the second residuals.

The alignment system that yields the lowest second residuals is the preferred alignment system for the wafer. The same applies to the alignment mark and the alignment signal parameter or algorithm.

Figure 8:
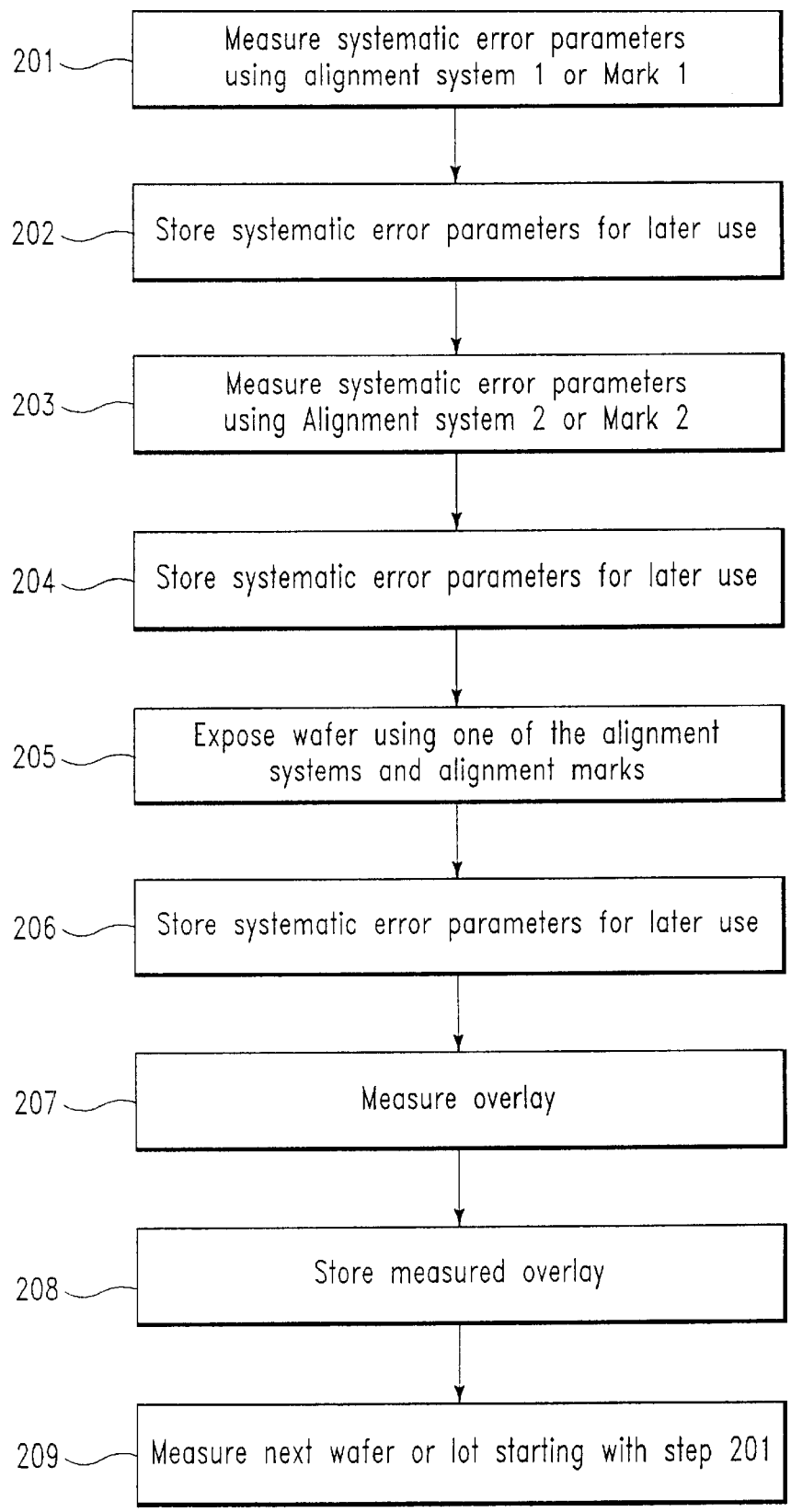
FIG. 8 is a flow chart showing process steps for building the data base of the third embodiment of the present invention.

In a third embodiment, alignment data is saved for the various alignment systems for each wafer. Once expose and develop is complete, overlay is measured for each wafer and saved along with the stepper settings used for the exposure. The overlay measurement is compared with the alignment system data to verify which alignment system would have actually provided the best alignment. FIG. 8 is a flowchart providing the process steps of building the data base for this embodiment to evaluate the various alignment systems and/or alignment marks. First, systematic error is measured using alignment system 1 or mark 1, as shown in step 201. This value is stored for later use, as shown in step 202. This process is repeated for each alignment system or alignment mark, as shown in steps 203 and 204. Next the wafer is exposed after being aligned using one of the alignment systems and alignment marks, as shown in step 205. Stepper settings used in this exposure are stored, as shown in step 206. After the wafer is developed, overlay is measured, as shown in step 207. The result is stored, as shown in step 208. A data base is built by repeating this process on succeeding wafers, as shown in step 209.

The comparison among the alignment systems and marks is then accomplished by determining a correlation between overlay measurement systematics and values projected from the data for each alignment system and each alignment mark. An alignment system need not have been used in an actual alignment of a wafer. But data for all alignment systems and marks can still be used in this correlation step. The alignment system that provides data for alignment marks that has the best correlation with the actual overlay result is the preferred alignment system.

This third embodiment is particularly useful for processes that change slowly over time. If a process is not changing at all then, of course, one alignment system can continue to be used. If the process is changing rapidly then the first or second embodiment is preferred. While the first or second embodiments have advantage in enabling quick reaction to process variations, the third embodiment has advantage in providing an alignment system-alignment mark combination that is correlated with actual overlay data.

The present invention is also applicable for evaluating and selecting among different signal analysis schemes. The scheme that gives the lowest residuals is selected. The signal analysis scheme can be an analysis algorithm to find a center point of the signal. One algorithm is to find the center of a signal at a specified slice level. Another algorithm is to fold the signal and look for where it is best folded to obtain the best agreement of the folded piece to the non-folded piece. The signal analysis scheme can also be a variable parameter of the analysis algorithm, such as the slice level.

Figure 9:
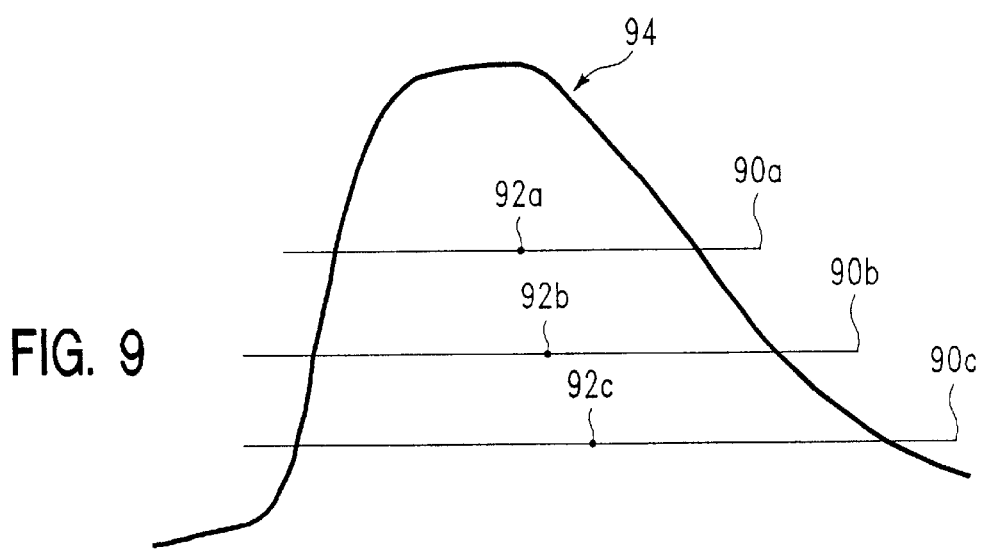
FIG. 9 shows the effect of choosing different slice levels on the location of the center of an alignment signal.

For example, signal analysis schemes may differ on slice level chosen 90a, 90b, 90c for determining center 92a, 92b, 92c of alignment signal 94, as shown in FIG. 9. The center of signal 94 determines the location of alignment mark 34 (FIG. 1). Analyzing signal 94 to determine its center involves making a choice of slice level 90a, 90b, 90c. Center 92a, 92b, 92c may depend on the slice level 90a, 90b, 90c chosen as shown in FIG. 9. In the first step a plurality of alignment signals 94 are provided, each signal coming from an alignment mark on a different part of wafer 30. Each of the signals 94 from each of the alignment marks is analyzed using several different slice levels 90a, 90b, 90c. Values of the center 92a, 92b, 92c of each alignment signal 94 are obtained for each slice level 90a, 90b, 90c. The values of the centers 92a, 92b, 92c are each compared to a values predicted from the previously described mathematical model of the array pattern taking into account systematic errors of the alignment system. Residuals are the differences between the calculated value from the alignment signal and the value determined from the model, and this number is recorded. The root mean square (RMS) of the residuals is calculated for each slice level and the slice level giving the smallest RMS is selected for use.

Several algorithms can be used to measure the center of the mark and the RMS of the residuals associated with each algorithm can be obtained as described herein above. The best algorithm or the best parameter of an algorithm can be selected using the method of the invention as the one that provides the smallest RMS of the residuals.

While several embodiments of the invention, together with modifications thereof, have been described in detail herein and illustrated in the accompanying drawings, it will be evident that various further modifications are possible in mathematical models or the metrics used to quantify the performance of the alignment system without departing from the scope of the invention. Nothing in the above specification is intended to limit the invention more narrowly than the appended claims. The examples given are intended only to be illustrative rather than exclusive.

What is claimed is:

1. A method of aligning a substrate to an exposure system, comprising the steps of:
   (a) providing a substrate on a stage of an exposure system, the exposure system comprising a plurality of alignment components;
   (b) gathering alignment data for a plurality of alignment combinations of at least two of said alignment components;
   (c) calculating an alignment-related parameter from the alignment data for each alignment combination of at least two of said alignment components, wherein the alignment-related parameter for each alignment combination includes indication of alignment combination quality; and
   (d) using the alignment related parameter to select an alignment combination for use in aligning the substrate; wherein the substrate remains on the stage of said system during said steps (b) to (d).

2. The method as recited in claim 1, further comprising the step of using said selected alignment combination for aligning the substrate.

3. The method as recited in claim 1, further comprising the step of exposing the wafer with said exposure system.

4. The method as recited in claim 1, wherein said plurality of alignment components comprises a plurality of alignment systems.

5. The method as recited in claim 1, wherein said plurality of alignment components comprises a plurality of alignment marks on the substrate.

6. The method as recited in claim 1, wherein said plurality of alignment components comprises a plurality of alignment signal analysis algorithms.

7. The method as recited in claim 1, wherein said plurality of alignment components comprises a plurality of alignment signal analysis parameters.

8. The method as recited in claim 1, wherein said alignment related parameter comprises residual error.

9. The method as recited in claim 8, wherein said residual error is obtained by subtracting linear components of alignment error.

10. The method as recited in claim 9, wherein said linear components include a translational term, a magnification term, and a rotational term.

11. The method as recited in claim 1, wherein the substrate comprises a plurality of exposure fields, wherein the method comprises measuring at least one target in each field of a plurality of exposure fields.

12. The method as recited in claim 1, wherein said alignment related parameter comprises a sum of squares of residual errors for said plurality of targets.

13. The method as recited in claim 1, wherein the substrate comprises a plurality of exposure fields, wherein each exposure field comprises a plurality of alignment targets.

14. The method as recited in claim 1, wherein the substrate comprises a semiconductor wafer.

15. A method of aligning a substrate to an exposure system, comprising the steps of:
   (a) providing a first substrate on a stage of an exposure stystem, the exposure system comprising a plurality of alignment components;
   (b) gathering alignment data for a plurality of alignment combinations of at least two of said alignment components for said first substrate;
   (c) aligning and first substrate and exposing the first substrate with said exposure system at an exposure setting;
   (d) measuring overlay data on said first substrate;
   (e) comparing said overlay data of said step (d) with said alignment data of said step (b);
   (f) providing a second substrate on said stage; and
   (g) using said comparison of said step (e) to select an alignment combination for use in aligning said second substrate.

16. The method as recited in claim 15, wherein said alignment components comprise alignment systems, alignment marks, and signal analysis schemes.

17. The method as recited in claim 16, wherein said plurality of signal analysis schemes comprise slice levels.

18. The method as recited in claim 15, further comprising the step of recording said exposure setting, said overlay data, and said alignment data.

19. The method as recited in claim 15, further comprising the step of recording said exposure setting and using said exposure setting in said comparing step (e).

20. The method as recited in claim 15, further comprising the step of using said selected alignment system for aligning the second substrate.

21. The method as recited in claim 20, further comprising the step of exposing the second substrate with the exposure system.

22. The method as recited in claim 15, wherein the first and second substrates comprise semiconductor wafers.

23. A method of selecting among signal analysis schemes to provide the most accurate alignment to a previous level, the method comprising the steps of:
   (a) providing a plurality of signals, wherein each signal is associated with different value of an independent variable;
   (b) providing a plurality of signal analysis schemes;
   (c) determining values of a first parameter for each signal and for each scheme at a plurality of values of an independent variable;
   (d) comparing said values of said first parameter to a model;
   (e) recording differences between said values of first parameters and said model;
   (f) calculating a second parameter depending on said differences; and
   (g) using said second parameter to select at least one signal analysis scheme.

24. The method as recited in claim 23, wherein said plurality of signals comprise alignment signals.

25. The method as recited in claim 23, wherein said independent variable comprises location on a semiconductor wafer.

26. The method as recited in claim 23, wherein said plurality of signal analysis schemes comprise slice levels.

27. The method as recited in claim 23, wherein said a first parameter comprises location of alignment mark.

28. The method as recited in claim 23, wherein said second parameter comprises RMS of difference of location of alignment mark from expected location.

* * * * *